United States Patent [19]

Shannon

[11] Patent Number: 4,797,722

[45] Date of Patent: Jan. 10, 1989

[54] HOT CHARGE-CARRIER TRANSISTORS

[75] Inventor: John M. Shannon, Whyteleafe, England

[73] Assignee: U.S. Philips Corporation, New York, N.Y.

[21] Appl. No.: 46,974

[22] Filed: May 5, 1987

[30] Foreign Application Priority Data

May 23, 1986 [GB] United Kingdom ............... 8612603

[51] Int. Cl.$^4$ ................. H01L 29/72; H01L 29/205
[52] U.S. Cl. ........................................ 357/34; 357/16; 357/4
[58] Field of Search ................ 357/34, 16, 4

[56] References Cited

U.S. PATENT DOCUMENTS 4,665,412  5/1987  Ohkawa et al. ..................... 357/4
4,695,857  9/1987  Bala et al. ............................ 357/4

FOREIGN PATENT DOCUMENTS 0159273   10/1985  European Pat. Off. ............. 357/4
58-42574   8/1983  Japan .................................. 357/34
60-242671 12/1985  Japan .................................. 357/34

Primary Examiner—Andrew J. James
Assistant Examiner—Jerome Jackson
Attorney, Agent, or Firm—Steven R. Biren

[57] ABSTRACT

Current flow through the base region of a hot charge-carrier transistor is by hot majority charge-carriers of one conductivity type (i.e., hot electrons for a hot electron transistor) which are injected into the base region at an emitter-base carrier region. In accordance with the invention a low base resistance is achieved by forming the base region as alternate layers of semiconductor material (for example silicon) and metal-based material (for example epitaxial cobalt or nickel silicide) which has a higher conductivity than the semiconductor material. The base-collector barrier is adjoined by a semiconductor layer of the base region, and the (or each) metal-based layer in the vicinity of the emitter-base carrier and/or the base-collector barrier is sufficiently thin (for example about 1nm or less) to permit quantum mechanical tunnelling. This aids efficient transmission of the hot charge-carriers through the base region and over the base-collector barrier. A high collection efficiency can be maintained by providing a bulk unipolar diode as the base-collector barrier formed with the adjoining semiconductor base-region layer. There may be a thicker central metal-based layer in the base region. The emitter-base barrier can be made sufficiently high that the average energy of the hot charge-carriers injected into the base region is significantly higher than potential barriers formed at heterojunction interfaces of the metal-based and semiconductor layers.

11 Claims, 2 Drawing Sheets

HOT CHARGE-CARRIER TRANSISTORS

BACKGROUND OF THE INVENTION

This invention relates to hot charge-carrier transistors having a base region through which current flow is by hot majority charge-carriers of one conductivity type, and relates particularly but not exclusively to hot electron transistors formed with monocrystalline silicon.

Early experimental forms of hot electron transistors are described on pages 587 to 615 of the book by S. M. Sze entitled "The Physics of Semiconductor Devices", 1969 edition published by Wiley Inter-science. Different transistor structures were considered involving layers of metal and insulator or of semiconductor and metal, but a common feature of all these devices was that the base region was formed by a single sandwiched layer of metal.

U.S. Pat. No. 4,492,971 describes an improved hot electron transistor but still with a metal-based material for the base region. This transistor has an essentially monocrystalline structure comprising a monocrystalline silicon layer forming an emitter on a single thin monocrystalline metal silicide layer which forms the base on a monocrystalline silicon substrate forming the collector. The single metal-silicide base layer is thin (typically 4, 6 or 8 nm) so as to be small compared to the hot electron scattering length in this base material and is made a multiple of the quantum mechanical transmission probability factor. The emitter-base and base-collector junctions are formed by Schottky barriers between the metal silicide base and the silicon emitter and collector.

With the invention of bulk unipolar diodes employing doped semiconductor materials, it became possible to fabricate high performance hot electron transistors and even hot hole transistors having semiconductor base regions. In such diodes the current flow is by majority carriers, but the diode barrier is a doped region in a semiconductor bulk rather than being a barrier at the semiconductor body surface (as is a Schottky barrier). A particularly high quality and efficient bulk unipolar diode is the so-called "camel diode" which is disclosed in U.S. Pat. No. 4,149,174, together with its use in the formation of hot charge-carrier transistors. Other hot charge-carrier transistors using similar bulk unipolar diodes are described in published United Kingdom patent application Nos. 2 056 165, 2 056 166 and 2 118 363.

Thus, from U.S. Pat. No. 4,149,174 and these published United Kingdom patent applications hot charge-carrier transistors are known comprising a semiconductor base region of one conductivity type through which current flow is by hot majority charge-carriers of the one conductivity type. Barrier-forming means forms with the base region an emitter-base barrier serving for injection of the hot charge-carriers of said one conductivity type into the base region. A semiconductor base-collector barrier region is doped with impurity of the opposite conductivity type and is sufficiently thin as to form with both the semiconductor collector and base regions of said one conductivity type a bulk unipolar diode for collecting the hot charge-carriers of said one conductivity type from the base region during operation of the transistor. This permits the achievement of a high collection efficiency for the hot charge-carriers from the semiconductor base, as compared with hot electron transistors having a metal-based base where it is found that quantum mechanical reflections at the abrupt metal-silicon base-collector Schottky interface degrades the collection efficiency.

SUMMARY OF THE INVENTION

According to the present invention there is provided a hot charge-carrier transistor comprising a base region through which current flow is by hot majority charge-carriers of one conductivity type, barrier-forming means which forms with the base region an emitter-base barrier serving for injection of the hot charge-carriers of said one conductivity type into the base region and a base-collector barrier for collecting the hot charge-carriers of said one conductivity type from the base region during operation of the transistor, the transistor being characterized in that the base region comprises alternate layers of semiconductor material of said one conductivity type and of metal-based material of higher conductivity than the semiconductor material, that the semiconductor layer or one of the semiconductor layers of the base region adjoins the base-collector barrier to provide the metal-based layer or layers of the base region separated from but extending substantially parallel to the base-collector barrier, and that the or each metal-based layer in the vicinity of the emitter-base barrier and/or the base-collector barrier is sufficiently thin to permit quantum mechanical tunnelling, thereby aiding efficient transmission of the hot charge-carriers through the base region and over the base-collector barrier.

By including one or more metal-based layers in this manner in the transistor base, a low base resistance can be achieved, and this is particularly significant in designing such transistors for performance at microwave frequencies. By also providing one or more layers of semiconductor material in the base region, and especially adjoining the base-collector barrier, the present invention permits this to be achieved while providing means to aid the transmission of the hot charge-carriers through the base region and over the base-collector barrier. Thus, by making at least the (or each) metal-based layer in the vicinity of the emitter-base and/or base-collector barrier sufficiently thin for quantum mechanical tunnelling, quantum mechanical reflections and other field disturbances of the hot charge-carriers at the interfaces of the metal-based layer(s) and semiconductor layer(s) are reduced even when the average energy of the hot charge-carriers as injected into the base region and as transmitted through the base region to the collector is significantly above the barrier heights occurring at these interfaces, i.e. even when the hot charge-carriers have sufficient energy to travel over these interface barriers rather than needing to tunnel therethrough. A high emitter-base barrier can be made in various ways to such a base region having these alternate layers. Furthermore, a high collection efficiency can be maintained in a transistor in accordance with the invention by retaining a bulk unipolar diode as the base-collector barrier formed with the adjoining semiconductor layer of the base region.

The expression "metal-based" refers to metallic materials which are based on one or more metals. The material may be a metal itself, or a metal alloy, or a combination of a metal with another material. A metal silicide is particularly advantageous as the metal-based material for a transistor formed in silicon, especially when the metal silicide is one which permits epitaxial growth with silicon. With gallium arsenide, epitaxial growth is possible with aluminium as the metal-based material.

The metal-based layer or one of the metal-based layers may adjoin the emitter-base barrier to provide (at a heterojunction with a semiconductor layer of the base region) an electric field which accelerates the hot majority charge-carriers in the base region towards the collector. This acceleration increases the component of the carrier energy in the direction of the base-collector barrier so reducing carrier scattering and facilitating their passage through the base region and over the base-collector barrier itself. Other measures may be taken to increase the height of the emitter-base barrier and hence to increase the energy of the injected hot charge-carriers with respect to both base-collector barrier and heterojunctions formed in the base region by the metal-based layers.

A particularly low base resistance can be achieved by having a large thickness for at least one of the metal-based layers which is present in or near the middle of the sequence of alternate layers. Thus, this thick metal-based layer may be too thick for quantum mechanical tunnelling. However the presence in the alternate layer sequence of the thin (tunnellable) metal-based layers in the vicinity of the emitter-base and/or base-collector barriers may form with the semiconductor layers a superlattice which serves to reduce the quantum mechanical reflections by smoothing an abrupt field transition which would otherwise occur at the emitter and collector sides of such a thick metal-based layer base region.

BRIEF DESCRIPTION OF THE DRAWING

These and other features in accordance with the invention are illustrated more specifically in embodiments of the invention now to be described, by way of example, with reference to the accompanying diagrammatic drawings, in which.

Figure 1:
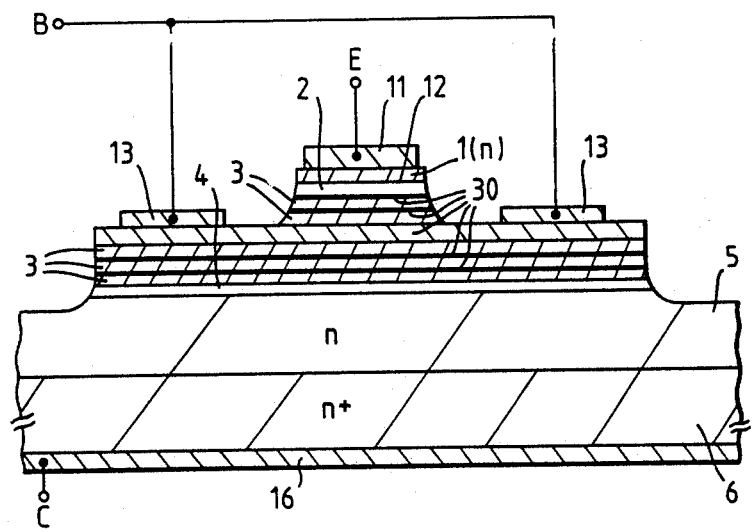
FIG. 1 is a cross-sectional view of part of a semiconductor body comprising a hot electron transistor in accordance with the invention.

It should be noted that all the Figures are diagrammatic and not drawn to scale. The relative dimensions and proportions of parts of these Figures (particularly in the direction of thickness of layers) have been shown exaggerated or diminished for the sake of clarity and convenience in the drawings. The same reference designations as used in one embodiment are generally used when referring to corresponding or similar parts in other embodiments. The thin depleted emitter-base and base-collector barrier regions are not hatched in the cross-section of FIG. 1.

DESCRIPTION OF THE PREFERRED EMBODIMENTS

FIG. 1 illustrates one particular structure for a hot charge-carrier transistor in accordance with the invention. The device is a hot electron transistor, having a base region comprising alternate n type semiconductor and metal-based layers 3 and 30 through which current flow is by hot majority charge-carriers, i.e. hot electrons. However it will be appreciated that the invention may be used in the construction of a hot hole transistor having opposite conductivity type regions to the corresponding regions of a hot electron transistor. Hot charge-carriers are those which are not in thermal equilibrium with the lattice. Thus, the average energy of hot electrons is considerably more than a few k.T above the average energy of electrons in equilibrium with the lattice (where k and T are the Boltzmann constant and the lattice temperature respectively). At room temperature k.T is about 25 meV.

The transistor illustrated in FIG. 1 comprises a monocrystalline body including semiconductor regions 1 to 6 (for example of silicon) and metal-based layers 30 (for example of metal silicide). The region 2 forms an emitter-base barrier with the base region 3,30 for injecting the hot charge-carriers (electrons). A base-collector barrier region 4 which is doped with impurity of opposite conductivity type (p type) to that of the hot charge-carriers (electrons) is sufficiently thin as to form with an adjacent semiconductor layer 3 of the base region a bulk unipolar diode for collecting the hot electrons from the base region 3 during operation of the transistor. The collector region 5,6 of n type semiconductor material also forms part of the bulk unipolar diode. Preferably the regions 3, 4 and 5 of the bulk unipolar diode are of the same bandgap monocrystalline semiconductor material (for example silicon) without heterojunctions in this diode so as to provide a high collection efficiency for the transistor in accordance with the invention.

The base region comprises alternate layers of n type semiconductor material 3 (for example silicon) and of metal-based material 30 (for example metal silicide) which is of higher conductivity than the semiconductor material 3. Adjacent semiconductor and metal-based layers form heterojunctions 31 extending substantially parallel to the base-collector barrier region 4.

Figure 2:
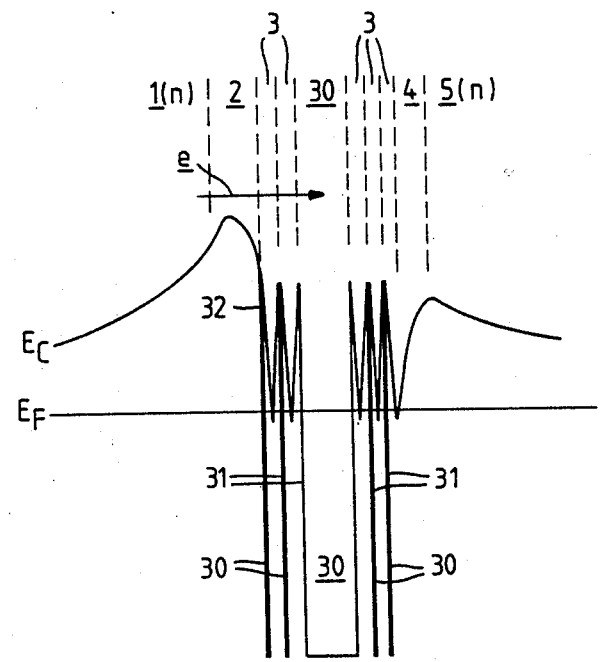
FIG. 2 is an energy diagram through the active part of the transistor of FIG. 1, showing the conduction band edge $E_c$.

At least the metal-based layers 30 which are in the vicinity of the emitter-base barrier 2 and/or the base-collector barrier region 4 are sufficiently thin (for example about 1 nm thick) to permit quantum mechanical tunnelling. This reduces quantum mechanical reflections and other field-disturbances of the hot electrons at the heterojunctions 31. As illustrated in FIG. 2, the emitter-base barrier 2 is formed to have a much higher barrier height (for example about 1 eV) compared with the heterojunctions 31 and base-collector barrier 4 (for example about 0.7 eV and 0.5 eV respectively). Such an emitter-base barrier 2 can be achieved in a variety of ways, for example as described in U.S. Pat. No. 4,149,174, GB Nos. 2 056 165 and 2 056 166. By providing such a high emitter-base barrier 2, the average energy of the hot electrons (e in FIG. 2) at least when injected into the base region from the barrier 2 is much higher than the barrier heights of the heterojunctions 31. Although losing energy in the base region, the average energy of these hot electrons transmitted through the base region to the base-collector barrier 4 remains high with respect to the heterojunctions 31 and base-collector barrier region 4. Thus, the hot electrons e can pass over the barriers of the heterojunctions 31 without needing to tunnel therethrough and, because of the thinness (1 nm or less) of the thin metal-based layers 30, the passage of these hot electrons e is hardly disturbed by the electric fields at these heterojunctions 31, particularly when the layers 3 and 30 form an epitaxial monocrystalline structure. Furthermore the tunnellable nature of the thin metal-based layers 30 does not inhibit the flow of the electrons which form the base current in the base region 3 and 30; these base-current electrons are in equilibrium with the lattice and hence have an average energy below the barrier height of the heterojunctions 31.

A metal layer 13 forms the base electrode connection. The provision of the metal-based layers 30 within the base region significantly reduces the base resistance. Thus, compared with a degenerately doped n type semiconductor base of the same total thickness (for example 10 nm), a periodic structure 30,3 containing such metal silicide layers 30 may have a base resistance of as much as ten times lower. A central layer 30 in the periodic structure may be much thicker, for example too thick to permit quantum mechanical tunnelling therethrough. Such a situation is illustrated in FIG. 2 and can result in a very low base resistance. Although only five metal-silicide layers 30 are shown in FIG. 2 for convenience, it will normally be desirable to have more, particularly more of the thin layers 30 alternating with semiconductor layers 3 to form a superlattice interface at both the emitter and collector sides of a thick central metal silicide layer 30.

Such superlattice interfaces reduce the tendency for hot electron reflection at the emitter and collector sides of the thick central layer. This tendency is also reduced by forming the layers 30 of cobalt silicide, nickel silicide or a similar monocrystalline metal-based material (such as described in U.S. Pat. No. 4,492,971) so as to provide an essentially epitaxial structure having a substantially monocrystalline lattice with the silicon regions 1 to 6. This tendency for reflection may also be reduced by tuning the thickness of each silicide layer 30 to the wavelength of the hot electrons in the base region. A sufficient superlattice of alternate thin layers 30 and 3 may be provided on the collector side of a thick central metal-silicide layer 30 with appropriately tailored barrier heights to smooth the abrupt silicide-silicon heterojunction to such an extent that it may form the base-collector barrier of the transistor without requiring a doped barrier region 4. However, a more optimum collection efficiency can be obtained when such a barrier region 4 is provided, and the presence of semiconductor layers 3 in the base region facilitates its provision.

The base-collector barrier region 4 may be formed, for example, by a bulk unipolar diode of the type described in U.S. Pat. No. 4,149,174. Thus, the region 4 may have a p type impurity concentration the magnitude of which determines the height of the potential barrier to the flow of electrons from the base region to the n type collector region 5,6. The barrier region 4 is sufficiently thin that depletion layers which it forms at zero bias with both the base and collector regions merge together in the region 4 to substantially deplete the whole of the region 4 of holes even at zero bias. To obtain such depletion at zero bias, the thickness and doping level of the region 4 must satisfy certain conditions as described in U.S. Pat. No. 4,149,174, while the height of the barrier is determined by the doping level of the region 4. In the form illustrated in FIG. 1, the collector region comprises an n-type epitaxial layer 5 on a highly doped n type substrate 6 with a metal layer 16 providing a collector electrode.

Figure 3:
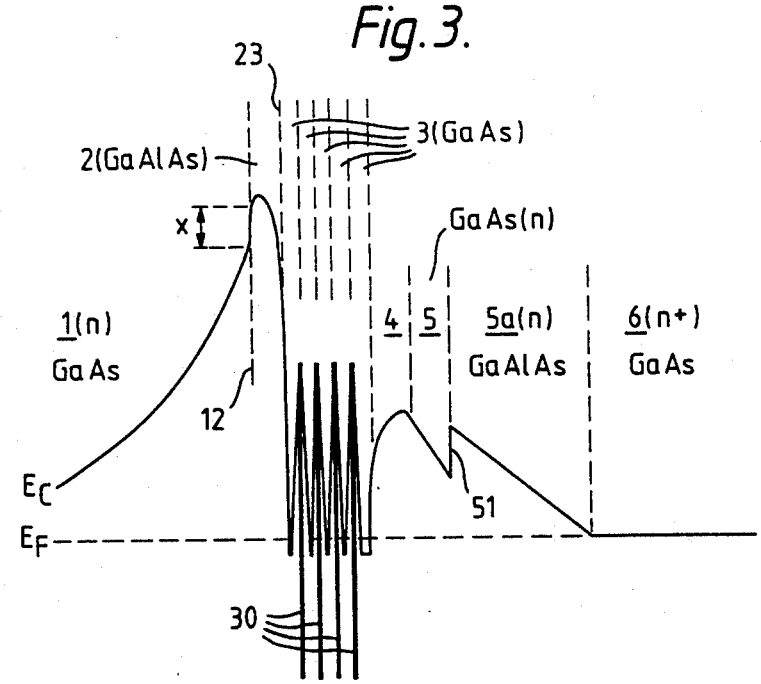
FIG. 3 is an energy diagram through the active part of another transistor also in accordance with the invention, showing the conduction band edge $E_c$.

The emitter-base barrier region 2 may also form part of a bulk unipolar diode between semiconductor regions 1 and 3, for example see FIG. 3. The p type doping level of the semiconductor region 2 determines the barrier height of the emitter-base barrier. In the transistors of FIGS. 1 to 3, the doped barrier region 2 is sufficiently thin to be depleted of holes at least during operation of the transistor. It may be such as to be undepleted over a part of its thickness at zero bias, as for example with the emitter-base barrier regions described in GB No. 2 056 166. However it may be depleted over the whole of its thickness even at zero bias, as with the barrier regions described in U.S. Pat. No. 4,149,174. In the particular form illustrated by way of example in FIG. 1, the transistor has a low doped n type emitter region 1 with which a metal layer 11 forms an ohmic contact to provide an emitter electrode.

As illustrated in FIGS. 1 and 2, one metal-based layer 30 may adjoin the emitter-base barrier region 2 and may form a heterojunction 32 with the first semiconductor base layer 3. This layer 30 may be somewhat thicker so that this heterojunction 32 nearest the emitter-base barrier 2 may provide within the base region an electric field serving to accelerate the hot electrons in the base region 3,30 towards the collector region 5.

The transistor of FIG. 1 may be formed with, for example, a monocrystalline highly-doped n type silicon substrate 6 on which an n type silicon epitaxial layer is then grown (for example using conventional vapor-phase epitaxial growth) to provide the collector region layer 5. Then, using molecular beam epitaxy of silicon, the p type doped barrier region 4 and adjacent n type doped base region part 3 can be grown. The shutter of a Knudson cell source of a metal such as nickel or cobalt is additionally opened during the molecular beam epitaxial growth of each metal-based layer 30 to form monocrystalline substantially epitaxial nickel silicide or cobalt silicide on each silicon part 3. Then the final p type layer 2 and n type layer 1 are grown by molecular beam epitaxy of silicon. At least the two upper layers 1 and 2 are locally removed throughout their thickness by etching to leave the emitter mesa structure illustrated for the regions 1 and 2 in FIG. 1, after which the layers 30, 3 and 4 are also locally removed throughout their thickness to leave the base mesa structure illustrated for the regions 30, 3 and 4 in FIG. 1.

The termination of the mesa etching for the regions 30, 3 and 4 is not critical due to the large thickness of the layer 5. The base region is however of smaller thickness so that the etching process for defining the emitter mesa 1 and 2 must be terminated with sufficient control to avoid etching through the exposed base region. This is achieved in accordance with the present invention by the semiconductor material (silicon) being selectively etchable with respect to an underlying metal-based (silicide) part 30 of the base region, for example either the uppermost silicide layer 30 or at least the thick central silicide layer 30. Several selective etchants are available for silicon on various silicides. The base connection 13 is then provided at an area of the silicide part 30 of the base region from which the overlying material is removed.

In a modification of the hot electron transistor of FIGS. 1 and 2, a much simpler two-layer (or three-layer) base region 3,30 is formed in which the alternate layer structure consists of only one metal-based layer 30 which is separated from the p type doped base-collector barrier region 4 by one n type semiconductor layer 3. This one metal-based layer 30 may adjoin the emitter-base barrier region 2, or it may be separated therefrom by a second semiconductor layer 3 of the base region 3,30.

A transistor based on silicon is advantageous because substantially monocrystallie structures can easily be formed with certain metal silicides, for example as described in U.S. Pat. No. 4,492,971. However the invention may also be used for transistors based on other semiconductor materials, for example III-V compound semiconductors such as gallium arsenide and mixed crystals based on gallium arsenide. Such an arrangement is illustrated in FIG. 3, in which the base region comprises alternate layers of, for example, epitaxial aluminum 30 and n type gallium arsenide 3 on a monocrystalline body portion 4 and 5 of gallium arsenide which comprises the bulk unipolar collector diode. Aluminum layers 30 may be for example at most about 1 nm wide, and GaAs layers 3 may be for example 6 nm wide. Semiconductor material 2 and 5a of wider bandgap (for example gallium aluminum arsenide) also forms heterojunctions with the gallium arsenide regions 1, 3, 5 and 6.

FIG. 3 illustrates inter alia the effect of the heterojunctions 23 and 51 on the conduction band edge $E_c$. The heterojunction 23 increases the barrier height of the emitter-base barrier region 2 by an amount x. However, the proportion of the total barrier height determined by the p type impurity doping of the region 2 is larger than x. Thus, x is about 0.35 eV for a heterojunction 23 between $Ga_{0.6}Al_{0.4}As$ and GaAs. A valence band step giving a higher hole energy in the barrier region 2 than in the adjacent regions is also formed at the heterojunction 23; in the particular example of a GaAs base part 3 and a $Ga_{0.6}Al_{0.4}As$ barrier region 2, the valence band step is about 0.15 eV. Thus, in this particular example with a total barrier height for electrons of about 0.95 eV, the corresponding well for holes is only about 0.6 eV so reducing the tendency for holes (i.e. minority carriers in the device) to be trapped and stored in the emitter-base barrier region 2 of a given height.

In the arrangement illustrated in FIG. 3, the depleted p type doped barrier region 2 of wide bandgap material also forms a heterojunction 12 with the n type emitter region 1 of, for example, GaAs. Thus x is the same on both the emitter and base sides of the region 2. However, the emitter region 1 may be of wide bandgap material, for example the same gallium aluminum arsenide material as the barrier region 2; this increases the emitter resistance. The material of the emitter region 1 may also be a graded composition with an AlAs mole fraction varying progressively from a layer of gallium arsenide adjacent the top surface to gallium aluminum arsenide at the interface 12 with the AlAs mole fraction of the barrier region 2.

Furthermore the emitter region 1 may be of opposite conductivity type (p type in these examples) to that of the base region 3 and be sufficiently low doped as to form a Schottky barrier with an emitter electrode 11. It is also possible for very thin, intrinsic (i.e. undoped or unintentionally doped) semiconductor layers to be present between the depleted p type doped barrier region 2 and the emitter and base regions 1 and 3 and between the depleted p type doped barrier region 4 and the base and collector regions 3 and 5. The semiconductor emitter region 1 may be omitted when a Schottky electrode 11 is provided. In an alternative arrangement, the emitter base barrier region 2 may be omitted when the first metal-based layer 30 forms a suitable Schottky barrier with the emitter region 1.

A further modification which may be included in a hot carrier transistor in accordance with the invention is also illustrated in FIG. 3. Thus, semiconductor material 5a of a wider bandgap (for example GaAlAs) may be present within the collector region 5,6 (otherwise of for example GaAs) to form a heterojunction 51 providing an electric field which retards the hot charge-carriers in the collector region 5,6 in the vicinity of the base-collector barrier region 4. The bandgap of the material 5a is larger than that of the base-collector barrier region 4 (for example GaAs), and the heterojunction 51 in the arrangement of FIG. 3 is spaced parallel from the base-collector barrier region by the narrow bandgap (for example GaAs) part 5 of the collector region. With this arrangement a high collector field is maintained in the part 5 in the immediate vicinity of the potential maximum of region 4 serving for efficient collection of the hot electrons, and the hot electrons are then cooled by the retarding field at the heterojunction 51, so reducing a tendency to create electron-hole pairs by ionization in the collector region and thus reducing hole trapping and storage in the base-collector barrier region 4.

I claim:

1. A hot charge-carrier transistor comprising a base region through which current flow is by hot majority charge-carriers of one conductivity type, barrier-forming means which forms with the base region an emitter-base barrier serving for injection of the hot charge-carriers of said one conductivity type into the base region, and a base-collector barrier for collecting the hot charge-carriers of said one conductivity type from the base region during operation of the transistor, wherein the base region comprises alternate layers of semiconductor material of said one conductivity type and of metal-based material of higher conductivity than that of the semiconductor material, one of the semiconductor layers of the base region adjoins the base-collector barrier so that each metal-based layer of the base region is separated from but extends substantially parallel to the base-collector barrier, and each metal-based layer in the vicinity of the emitter-base barrier and each metal-based layer in the vicinity of the base-collector barrier is sufficiently thin to permit quantum mechanical tunnelling, having a thickness of less than or equal to 1 nm, thereby aiding efficient transmission of the hot charge-carriers through the base region and over the base-collector barrier.

2. A transistor as claimed in claim 1, further characterized in that heterojunctions formed by the alternate semiconductor and metal-based layers have barrier heights below the average energy of the hot charge-carriers transmitted through the base region from the emitter-base barrier.

3. A transistor as claimed in claim 1 or claim 2, further characterized in that the base-collector barrier is formed by a semiconductor barrier region located between the adjoining semiconductor layer of the base region and a semiconductor collector region also of said one conductivity type, which semiconductor base-collector barrier region is doped with an impurity of the opposite conductivity type and is sufficiently thin as to form with said semiconductor collector region and said adjoining semiconductor base-region layer a bulk unipolar diode for collecting the hot charge-carriers of said one conductivity type from the base region during operation of the transistor.

4. A transistor as claimed in claim 3, further characterized in that the base region comprises substantially epitaxial alternate layers of a metal-silicide and of one conductivity type silicon on a monocrystalline silicon body portion which comprises the bulk unipolar diode.

5. A transistor as claimed in claim 3, further characterized in that the base region comprises substantially epitaxial alternate layers of aluminum and of one conductivity type gallium arsenide on a monocrystalline body portion comprising gallium arsenide which includes the bulk unipolar diode.

6. A transistor as claimed in claim 1 or 2, further characterized in that at least one of the metal-based layers is present below a layer of semiconductor material selectively etchable with respect to that metal-based layer, and that a base connection contacts the base region at an area of that metal-based layer from which the semiconductor material is removed.

7. A transistor as claimed in claim 1 or 2, further characterized in that one of the metal-based layers adjoins the emitter-base barrier and forms a heterojunction with the adjacent semiconductor base region layer to provide an electric field serving to accelerate the hot charge-carriers in the base region towards the collector region.

8. A transistor as claimed in claim 1 or 2, further characterized in that the base region comprises a plurality of the metal-based layers, one of which is too thick for quantum mechanical tunnelling and is present in or near the middle of the sequence of alternate layers.

9. A transistor as claimed in claim 1 or 2, further characterized in that the alternate layers in the base region form a periodic structure tuned to the wavelength of the hot charge-carriers in the base region.

10. A transistor as claimed in claim 1 or 2, further characterized in that said one conductivity type is n type, so providing a hot electron transistor.

11. A transistor as claimed in claim 1 or 2, further characterized in that semiconductor material of a wider bandgap is present within the collector region to form a heterojunction providing an electric field which retards the hot charge-carriers in the collector region in the vicinity of the base-collector barrier region.

* * * * *